(12) United States Patent
Osterberg et al.

(10) Patent No.: US 11,131,700 B2
(45) Date of Patent: Sep. 28, 2021

(54) POSITION CORRECTION METHOD AND A SYSTEM FOR POSITION CORRECTION IN RELATION TO FOUR PROBE RESISTANCE MEASUREMENTS

(71) Applicant: CAPRES A/S, Kgs. Lyngby (DK)

(72) Inventors: Frederik Westergaard Osterberg, Hellerup (DK); Alberto Cagliani, Copenhagen (DK); Dirch Hjorth Petersen, Herlev (DK); Ole Hansen, Horsholm (DK)

(73) Assignee: CAPRES A/S, Kgs. Lyngby (DK)

( * ) Notice: Subject to any disclaimer, the term of this patent is extended or adjusted under 35 U.S.C. 154(b) by 67 days.

(21) Appl. No.: 16/475,362

(22) PCT Filed: Jan. 8, 2018

(86) PCT No.: PCT/EP2018/050333
§ 371 (c)(1),
(2) Date: Jul. 1, 2019

(87) PCT Pub. No.: WO2018/127581
PCT Pub. Date: Jul. 12, 2018

(65) Prior Publication Data
US 2019/0310295 A1    Oct. 10, 2019

(30) Foreign Application Priority Data

Jan. 9, 2017  (EP) ..................................... 17150630
Feb. 10, 2017  (EP) ..................................... 17155668

(51) Int. Cl.
*G01R 27/08*    (2006.01)
*G01R 1/067*    (2006.01)
(Continued)

(52) U.S. Cl.
CPC .......... *G01R 27/08* (2013.01); *G01R 1/06794* (2013.01); *G01R 1/073* (2013.01); *G01R 27/14* (2013.01)

(58) Field of Classification Search
None
See application file for complete search history.

(56) References Cited

U.S. PATENT DOCUMENTS 4,703,252 A     10/1987  Perloff et al.
4,989,154 A *   1/1991   Yamashita ............. G01R 27/14
                                                     702/65

(Continued)

FOREIGN PATENT DOCUMENTS

CN    101241153 A    8/2008
CN    101331403 A    12/2008
(Continued)

OTHER PUBLICATIONS

Mikael Hansen et al., Eliminating Inline positional errors for four-point resistance measurement, Dec. 24, 2008, Capres AS, CN101331403 (A), G01R27/08 (Year: 2008).*
(Continued)

*Primary Examiner* — Nasima Monsur
(74) *Attorney, Agent, or Firm* — Hodgson Russ LLP

(57) ABSTRACT

The present invention relates to a method of establishing specific electrode positions by providing a multi-point probe and a test sample. The method comprises the measuring or determining of a distance between two of the electrodes of the multi-point probe and establishing a resistance model representative of the test sample. The method further comprises the performing of at least three different sheet resistance measurements and establishing for each of the different sheet resistance measurement a corresponding predicted sheet resistance based on the resistance model. Thereafter the method comprises the establishment of a set of differ- (Continued)

ences constituting the difference between each of the predicted sheet resistance and its corresponding measured sheet resistance, and deriving the specific electrode positions of the multi-point probe on the surface of the test sample by using the distance and performing a data fit by minimizing an error function constituting the sum of the set of differences.

20 Claims, 9 Drawing Sheets

(51) Int. Cl.
*G01R 1/073* (2006.01)
*G01R 27/14* (2006.01)

(56) References Cited

U.S. PATENT DOCUMENTS

| | | |
|---|---|---|
| 5,691,648 A | 11/1997 | Cheng |
| 6,747,445 B2 | 6/2004 | Fetterman et al. |
| 6,943,571 B2 | 9/2005 | Worledge |
| 7,034,519 B2 | 4/2006 | Abraham et al. |
| 7,852,093 B2 | 12/2010 | Hansen |
| 8,907,690 B2 | 12/2014 | Petersen et al. |
| 2004/0183554 A1* | 9/2004 | Worledge ............... G01R 27/14 324/719 |
| 2005/0081609 A1 | 4/2005 | Worledge |
| 2005/0151552 A1 | 7/2005 | Abraham et al. |

FOREIGN PATENT DOCUMENTS

| | | |
|---|---|---|
| CN | 101587412 A | 11/2009 |
| CN | 101876674 A | 11/2010 |
| CN | 102338811 A | 2/2012 |
| CN | 102520835 A | 6/2012 |
| CN | 103380368 A | 10/2013 |
| CN | 106197477 A | 12/2016 |
| JP | S60161504 A | 8/1985 |
| KR | 20090019947 A | 2/2009 |
| WO | WO2007045246 | 4/2007 |
| WO | WO2009030230 | 3/2009 |
| WO | WO2012083955 | 6/2012 |
| WO | 2015067818 A1 | 5/2015 |
| WO | WO 2015/067818 A1 * | 5/2015 ............ G01R 27/00 |
| WO | WO2015067818 | 5/2015 |

OTHER PUBLICATIONS

International Search Report on corresponding PCT application (PCT/EP2018/050333) from International Searching Authority (EPO) dated May 11, 2018.
Written Opinion on corresponding PCT application (PCT/EP2018/050333) from International Searching Authority (EPO) dated May 11, 2018.
Worledge, D. C.; "Reduction of positional errors in a four-point probe resistance measurement"; Applied Physics Letters, AIP Publishing LLC, US; vol. 84, No. 10, pp. 1695-1697. Mar. 8, 2004.
Van Der Pauw, L. J.; "A method of measuring the resistivity and hall coefficient on lamellae of arbitrary shape"; Philips Technical Review; vol. 20, pp. 220-224; 1958.
Van Der Pauw, L. J.; "A method of measuring specific resistivity and hall effect of discs of arbitrary shape"; Philips Research Reports; vol. 13, No. 1, pp. 1-9; Feb. 1958.
Liu, Xinfu et al., "Research on Instrument for Testing Sheet Resistance Without Testing Pattern and the Orientation of Probes", Chinese Journal of Semiconductors, Feb. 29, 2004, vol. 25, issue 2, pp. 221-226, China.
Liu, Xinfu et al., "The principle and application of testing sheet resistance with four-probe techniques", Semiconductor Technology, Jul. 31, 2004, Issue 7, pp. 48-52, China.
Worledge, D. C., "Reduction of positional errors in a four-point probe resistance measurement", Applied Physics Letters, Mar. 2, 2004, vol. 84, Issue 10, pp. 1695-1697, USA.
CNIPA, First Office Action for CN Application No. 201880006205.7, dated Feb. 4, 2021.

* cited by examiner

POSITION CORRECTION METHOD AND A SYSTEM FOR POSITION CORRECTION IN RELATION TO FOUR PROBE RESISTANCE MEASUREMENTS

CROSS-REFERENCE TO RELATED APPLICATIONS

This application is the national phase entry, under 35 U.S.C. Section 371(c), of International Application No. PCT/EP2018/050333, filed Jan. 8, 2018, claiming priority from European Patent Application Nos. 17150630.6, filed Jan. 9, 2017, and 17155668.1, filed Feb. 10, 2017. The disclosures of the International Application and the European Applications from which this application claims priority are incorporated herein by reference in their entirety.

FEDERALLY SPONSORED RESEARCH OR DEVELOPMENT

Not Applicable

The present invention relates to a position correction method and a system for position correction in relation to four probe resistance measurements.

BACKGROUND

Multi-electrode probes are commonly used to determine one or more electrical parameters of a test sample. When performing such measurements the multi-electrode probe is brought into contact with the sample surface in order to create electrical contact. The actual location of contact between the electrodes and the sample surface will invariably differ from the designed positions at each given electrodes-surface engage in a random fashion, giving rise to geometrical errors, which translate into the finite repeatability and reproducibility of the sample electrical parameters estimation. In particular, when a multi-electrode probe with collinear electrodes is used, it is possible to distinguish in-line and off-line position errors. The in-line position errors give the major contribution, while the off-line position errors give a second order contribution. The present invention provides a method and system for reducing the impact of in-line positional errors especially for multi-electrode probe electrical measurements.

The current prior art methods to perform position error correction of multi-electrode probe measurements on electrically conductive samples have been described by L. J. van der Pauw in the well-known publications Philips Res. Rep. 13, 1 1958 and Philips Tech. Rev. 20, 220 1958, and D. C. Worledge in Appl. Phys. Lett. 84, 1695 (2004) and in US patent application US 2004/0183554. A typical formulation of the so-called van der Pauw method relies on the following relationship:

$$\exp\left(\frac{-2\pi R_A}{R_0}\right) + \exp\left(\frac{-2\pi R_B}{R_0}\right) = 1,$$

where $R_A$ and $R_B$ are the resistance measurements done in the well known A and B configurations, whereas $R^0$ is the sheet resistance to be estimated. D. C. Worledge gave a simplified version as:

$$R_0 = 2\pi \frac{R_A + \alpha R_B}{\ln \gamma_A + \alpha \ln \gamma_B},$$

where the $\alpha$, $\gamma_A$ and $\gamma_B$ are coefficients that depend only on the four designed electrode coordinates.

The above prior art position correction methods assume that the sample is an infinite sheet composed of a single layer. If such assumption is satisfied and if such probe is placed at a distance from any sample boundary much bigger than the largest distance between two electrodes, the position correction methods developed in the prior art work adequately when using the multi-electrode probe on single layered test sample.

However, it should be noticed that the two position correction methods in the prior art do not estimate the actual relative distances between the electrodes, but they rather rely on the relation between the geometrical logarithmic terms that fully describe the resistance value measured, given the sheet resistance. In other words, the prior art position correction methods work efficiently only when the resistance measured value $R_A$ and $R_B$ can be written as:

$$R_{A(B)} = \frac{R_0}{2\pi} \ln(\gamma_{A(B)})$$

However, when the measurements are not performed under these ideal conditions, such as on a Magnetic Tunnel Junction (MTJ) stack comprising two or more sheets separated by a non-conductive tunnelling barrier layer, or close to the boundary of a single sheet, or in case the sheet is about the same size or just slightly larger than the multi-electrode probe or under similar geometrical constraints, the above methods will in the best case only yield a rough position correction or not yield any position correction at all, or in the worst case, the measurements will be distorted due to a faulty position correction.

Approaching the boundary of the test sample will depart from the ideal infinite single layer assumption of the prior art since the current will be limited by the boundary and thus the resistance will be higher near the boundary. Correspondingly, using a multi layered test sample will allow the current to redistribute in multiple layers according to their individual layer sheet resistance and the distance from the current injection electrodes, introducing a characteristic length scale absent in the case of single infinite sheet.

The relevant mathematical models for two of the mentioned cases are described in the publication by D. C. Worledge and P. L. Trouilloud, Appl. Phys. Lett 83 84 (2003), where it presents a resistance model for magnetic tunnel junctions (MTJ) using tunnel in plane tunnelling (CIPT), and in U.S. Pat. No. 8,907,690 B2 and in the publication by D. H. Petersen et al, J. Appl. Phys. 104 (2008), which describe a resistance model for a micro-Hall effect measurement near a boundary. It can be clearly seen how the electrical resistance model for four-point probe measurement cannot be described simply as in the expression above.

It is thus an object of the present invention to provide technologies which enable an effective geometrical position correction also for the above mentioned special cases, i.e. using multi layered test samples or in cases when the test sample cannot be considered to be infinite, i.e. close to the boundary of a large test sample or when the test sample is small comparable to the four-point probe. The inventors have found out that the existing methods begin to fail when measuring closer to a boundary that is about 2-3 probe widths.

Related systems and methods may be found in publications such as U.S. Pat. Nos. 6,943,571, 4,703,252, 5,691,648, 6,747,445, 7,034,519 B2, US 2005/0151552, US 2005/0081609. Reference is made to all of the above-mentioned US patent publications, all of which are hereby incorporated in the present specification by reference in their entirety for all purposes.

Reference is also made to the applicant's own patent U.S. Pat. No. 7,852,093 B2 and related PCT application WO 2007/045246 which relates to a method for calculating a correction factor for reduction of positioning errors in resistance measurements using four-point probes. The method involves measuring a first and a second four-point resistance and calculating a correction factor based on these measurements.

Further, the international applications WO 2009/030230 A1 and WO 2012/083955 A1 as well as the publications Micro four point probe Hall effect measurement method, Journal of applied physics 104 (2008), Characterization of magnetic tunnel junction test pads, F. W. sterberg et al, J. Appl. Phys. 118 2015 and High precision micro scale Hall effect characterization method using in-line micro four point probes, D. H. Petersen et al., 16$^{th}$ IEEE international conference on advanced thermal processing of semiconductors, all provide further useful background information to the present patent application.

SUMMARY OF THE INVENTION

The above need and the above object is according to the teachings of the present invention achieved in a first aspect of the present invention by a method of establishing specific electrode positions by providing a multi-point probe and a test sample, the multi-point probe having a probe body and a plurality of probe arms extending parallel from the body and each including one electrode, the plurality of probe arms and electrodes, respectively, being greater than four, the test sample defining a surface, the method comprising the steps of:

positioning the multi-point probe such that the electrodes are in contact with the surface of the test sample, determining a distance between two of the electrodes of the multi-point probe, preferably the two outermost electrodes of the multi-point probe, establishing a resistance model representative of the test sample, the resistance model having the specific electrode positions of the multi-point probe relative to the surface of the test sample included as unknown parameters, the resistance model representing the test sample as a finite sheet and/or a multilayered sheet, performing at least four different resistance measurements, each of the resistance measurement including:
  selecting four different electrodes of the plurality of electrodes,
  dividing the four different electrodes into a first pair of electrodes and a second pair of electrodes,
  applying a current propagating through the test sample between the first pair of electrodes,
  detecting an voltage induced between the second pair of electrodes, and
  establishing a measured resistance based on a ratio of the voltage and the current, establishing for each of the different resistance measurement a corresponding predicted resistance based on the resistance model, establishing a set of differences constituting the difference between each of the predicted resistance and its corresponding measured resistance, and deriving the specific electrode positions of the multi-point probe on the surface of the test sample by using the distance and performing a data fit by minimizing an error function constituting the sum of the set of differences.

The present method is preferably computer implemented and may be used in conjunction with prior art measurement methods and position correction methods. It is understood that if the measurement takes place under conditions in which the test sample may be assumed to be infinite and single sheet, the above-mentioned prior art methods may be used. In the present context, a multi-point probe is understood to be the same as a multi-electrode probe. The method establishes the electrode positions by an estimation of the electrode positions.

In the present method, it is assumed that the measurement takes place under conditions at which it is not advisable to assume that the test sample is an infinite single sheet, i.e. when the measurement takes place adjacent the boundary of the test sheet or in case the test sheet is multi-layered. Thus, the resistance model to be used in the present case should not assume an infinite sheet and/or a single layer, but assume a non-infinite sheet, i.e. a finite sheet and/or a non-single sheet, i.e. multi-layer sheet having at least two conductive layers.

The multi-point probe used in the present computerized method is generally known in the art and comprises at least five parallel probe arms each having an electrode. The electrode is simply the point of contact between the probe arm and the test sample. Thus, the electrodes typically define a straight line between themselves. However, there may be an error in the positioning of the probe arm/electrode such that the point of contact is not as expected but differs by an error from the expected position. The method assumes that the physical distance between two of the probe arms, i.e. electrodes, is known, e.g. by physical measurement or otherwise. Typically, the distance between two outermost electrodes is used since it will be the largest distance and thus the relative error will be as small as possible. In other words, the determination of the distance between two of the electrodes may be made by assuming a distance. Such assumption may be based on measurements, data sheets or any appropriate method.

The resistance model uses the electrode position of each electrode as an unknown variable. Depending on the number of probe arms of the multi-point probe, a number of different and independent measurements may be made. Using five probe arms and corresponding electrodes, i.e. the specified minimum, four independent measurements may be made. Using twelve probe arms and corresponding electrodes, a total of eleven independent measurements may be made as a minimum. More measurements may be made, such as typically 14.

For each independent measurement, four out of the at least five electrodes are used, two of which are used for driving a current between themselves and the remaining two for measuring a voltage. From this, a resistance may be calculated. The exact positions of the four electrodes are crucial for the precision of the measurement. By different measurement is meant that all of the measurements use different configurations of the four probes, i.e. in relation to driving a current and measuring a voltage.

The error function of the data fit to be minimized is the sum of the difference between the electrical resistance values as measured by the multi-point probe and the model prediction. It is understood that each difference to be included in the sum, i.e. each difference between a measured value and its corresponding predicted value, is a positive value. Such difference can be calculated in several ways. The most common ways of calculating the sum of the differences are to use a sum of the absolute value of each difference, using the sum of the square value of the difference or use any even power of the difference greater than power two. Usable methods include the least square method and the least absolute deviation method.

According to a further embodiment of the first aspect, the test sample is a multi-layered sheet constituting a magnetic tunnel junction and the resistance model represents a magnetic tunnel junction. It is understood that a multi-layered sheet is a sheet having two conductive layers, which is separated by a thin insulation layer. Such sheet will depart from the idealized single layer sheet of the prior art and thus, the presently suggested position correction/determination method is usable. The multi-layered sheets are used in e.g. fabrication of wafers for Magnetic Random Access Memory.

According to a further embodiment of the first aspect, the test sample has two or more conductive layers, such as three, four or five layers. Two conductive layers will be separated by a thin insulating film. The layers are designated as top layer and bottom layer where the top layer defines the surface at which the measurement is taking place, i.e. which is contacted by the electrodes. It is also feasible to use three layers, one top layer, one middle layer and one bottom layer. The top layer and the middle layer are separated by a thin insulating film and similarly also the middle layer and the bottom layer are separated by a thin insulating film. Likewise, the test sample may comprise more than three conductive layers, which are separated by insulating films.

According to a further embodiment of the first aspect, the resistance model for more than a single infinite conductive layer, i.e. using a magnetic tunnel junction and current in plane tunnelling (CIPT), may be written as:

$$R^i = \frac{R_T R_B}{2\pi(R_T + R_B)}\left\{\frac{R_T}{R_B}\left(K_0\left(\frac{w^i}{\lambda}\right) + K_0\left(\frac{z^i}{\lambda}\right) - K_0\left(\frac{y^i}{\lambda}\right) - K_0\left(\frac{x^i}{\lambda}\right)\right) + \ln\left(\frac{x^i y^i}{z^i w^i}\right)\right\}.$$

where $R^T$ is the top-layer resistance, $R_B$ is the bottom-layer resistance and $\lambda$ is the transition length. $K_0$ is the modified Bessel function of the second kind, 0'th order. The values $x^i$, $y^i$, $z^i$ and $w^i$ are here the distances between probe arms in a given configuration and $\lambda$ is given by $$\lambda = \sqrt{\frac{RA}{R_T + R_B}},$$

where RA is the resistance area product.

According to a further embodiment of the first aspect, the test sample is an MRAM wafer. The above-mentioned magnetic tunnel junction is preferably used in relation to MRAM wafers. MRAM has several advantages compared to existing RAM types, such as low power consumption, high radiation resistance, scalable production, as fast as SRAM and being non-volatile, i.e. no need for refresh and allowing fast start-up. The application for MRAM includes level 3 cache in CPUs and dedicated embedded memories in the near future and as replacement of SRAM and DDRAM in the far future.

According to a further embodiment of the first aspect, the electrodes are placed adjacent a boundary of the surface of the test sample and the resistance model represents a micro-Hall effect measurement. It is understood that a micro-Hall effect measurement in close proximity of a boundary, i.e. an insulating barrier, will depart from the idealized single infinite layer sheet of the prior art and thus the presently suggested position correction/determination method is usable.

According to a further embodiment of the first aspect, the surface of the test sample extends in any direction less than twice the distance between the two outermost electrodes of the multi-point probe, or alternatively, wherein at least one of the electrodes is located closer to the boundary than twice the distance between the two outermost electrodes of the multi-point probe.

According to a further embodiment of the first aspect, the resistance model is:

$$R_{HALL} = \frac{R_0}{4\pi}\left[\left(1 + \frac{R_H^2}{R_0^2}\right)\ln\frac{(x^i)^2(y^i)^2}{(z^i)^2(w^i)^2} + \left(1 - \frac{R_H^2}{R_0^2}\right)\ln\frac{[(x^i)^2 + 4l^2][(y^i)^2 + 4l^2]}{[(z^i)^2 + 4l^2][(w^i)^2 + 4l^2]}\right] + \frac{R_H}{\pi}\left[\arctan\frac{z^i}{2l} + \arctan\frac{x^i}{2l} + \arctan\frac{w^i}{2l} - \arctan\frac{y^i}{2l}\right],$$

where $R_0$ is the sheet resistance, $R_H$ is the Hall effect sheet resistance, $x^i$, $y^i$, $z^i$ and $w^i$ are the distances between probe arms in a given configuration, while l is the distance between the collinear probe and a parallel insulating sample boundary.

According to a further embodiment of the first aspect, the test sample is of a semiconductor material. Typically, the measurements are made on a silicon wafer or a germanium wafer.

According to a further embodiment of the first aspect, the plurality of probe arms and electrodes, respectively, is between 5-100, preferably between 6-50, more preferably between 8-25, most preferably between 10-15, such as 12. More than four probe arms and associated electrodes are required in order to achieve a sufficient number of independent measurements. The more probe arms used, the more independent measurements can be obtained. Ideally, twelve probe arms and electrodes are used.

According to a further embodiment of the first aspect, the number of different sheet resistance measurements is between 3-50, preferably between 4-25, more preferably between 5-15, most preferably between 6-10, such as 8. By using twelve probe arms and associated electrodes, a total of eight independent measurements can be made, and the position of the electrodes can be resolved with a high accuracy.

According to a further embodiment of the first aspect, the error function e to be minimized during the fitting of the resistance model to the data is:

$$e = \Sigma_{n=1}^{m}(f(\alpha,\beta_n) - R_n(\beta_n))^2.$$

The first term in the sum $f(\alpha, \beta_n)$ represents the model predicted resistances and the second term $R_n(\beta_n)$ represents the corresponding measured resistances. $f$ is the resistance model function, $\alpha$ represents a vector containing the sample parameters and $\beta_n$ represents a vector containing the positions of the four probes used in any independent measurement n. m is the number of four-point measurements made. This equation implements a multi-variable least square data fit method to extract at the same time the relevant electrical sample parameters and the actual positions of the electrodes, which are not considered fixed. The least square method allows a high precision at reasonable computational time.

According to a further embodiment of the first aspect, the method comprises the additional step of determining electrical parameters such as voltage, current or resistance. When the position of the electrodes has been derived with high accuracy, the sample electrical parameters may be determined. The sample electrical parameters may be determined at the same time or subsequent to the previous steps.

According to a further embodiment of the first aspect, the method comprises the further additional step of determining a sheet resistance. The sheet resistance of the sample, as well as other sample parameters, may be determined by using the current, the voltage and the electrode positions from the measurements.

The above need and the above object are according to the teachings of the present invention achieved in a second aspect of the present invention by a computer-based system for establishing specific electrode positions, the system including a multi-point probe, the multi-point probe having a probe body and a plurality of probe arms extending parallel from the body and each including one electrode, the plurality of probe arms and electrodes, respectively, being greater than four, the multi-point probe being positionable such that the electrodes are in contact with a surface of a test sample, two of the electrodes of the multi-point probe, preferably the two outermost electrodes of the multi-point probe, defining a distance between themselves, the system including a resistance model representative of the test sample, the resistance model having the specific electrode positions of the multi-point probe relative to the surface of the test sample included as unknown parameters, the resistance model representing the test sample as a finite sheet and/or a multilayered sheet, the system further including:

means for performing at least four different resistance measurements, each of the resistance measurements involving:
selecting four different electrodes of the plurality of electrodes,
dividing the four different electrodes into a first pair of electrodes and a second pair of electrodes,
applying a current propagating through the test sample between the first pair of electrodes,
detecting a voltage induced between the second pair of electrodes, and
establishing a measured resistance based on a ratio of the voltage and the current,
means for establishing for each of the different resistance measurement a corresponding predicted resistance based on the resistance model,
means for establishing a set of differences constituting the difference between each of the predicted resistance and its corresponding measured resistance, and
means for deriving the specific electrode positions of the multi-point probe on the surface of the test sample by using the distance and performing a data fit by minimizing an error function constituting the sum of the set of differences.

The above computer-based system according to the second aspect is preferably used for executing any of the methods according to the first aspect. The method may also be implemented in the form of a software pack for an existing computer-based system.

DETAILED DESCRIPTION OF THE DRAWINGS

Figure 1:
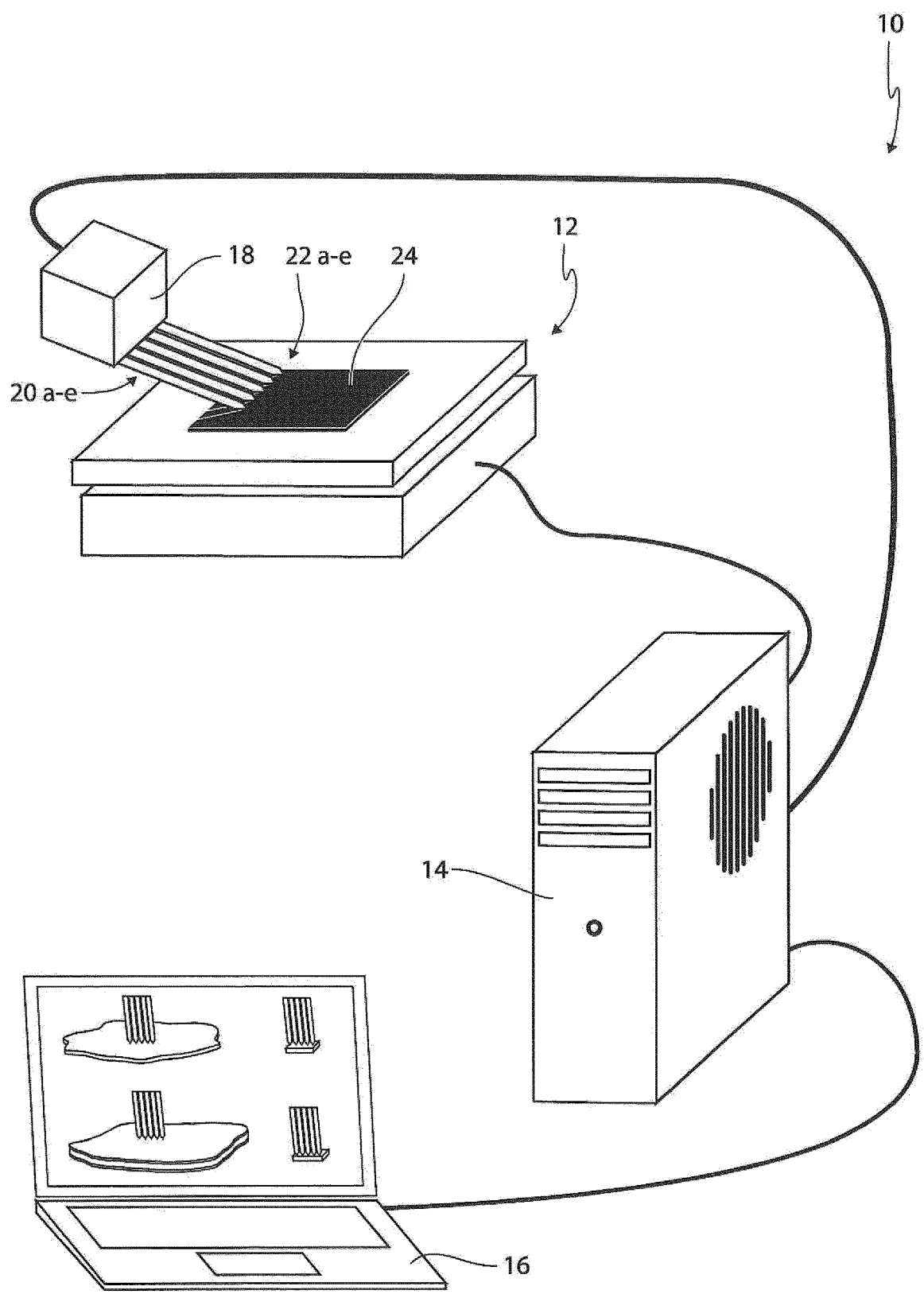
FIG. 1 is a schematic perspective view of a computer-based system according to the present invention.

FIG. 1 shows a schematic perspective view of a computer-based system 10 according to the present invention, illustrating schematically the multi probe measurement setup 12 used for performing a multi-probe resistance measurement.

The computer-based system 10 comprises the multi-probe measurement setup 12 connected to a stationary computer 14 for controlling the measurements. The stationary computer 14 may be located in a separate cabinet as illustrated here or alternatively be integrated as a part of the multi probe measurement setup 12. The stationary computer 14 may be connected to a laptop computer 16 for providing an easy user interface for illustrating and controlling the measurements, however, the laptop computer 16 may evidently be replaced by a monitor and a keyboard, or other suitable interfaces.

The multi probe measurement setup 12 is located in a controlled clean environment and includes a probe body 18. The probe body 18 in turn includes a plurality of probe arms, in the present case five probe arms 20*a-e*. Each of the probe arms 20*a-e* includes an electrode 22*a-e* constituting the tip of the respective probe arm 20*a-e*. The electrodes 22*a-e* contact the surface of a test sample 24.

Figure 2A:
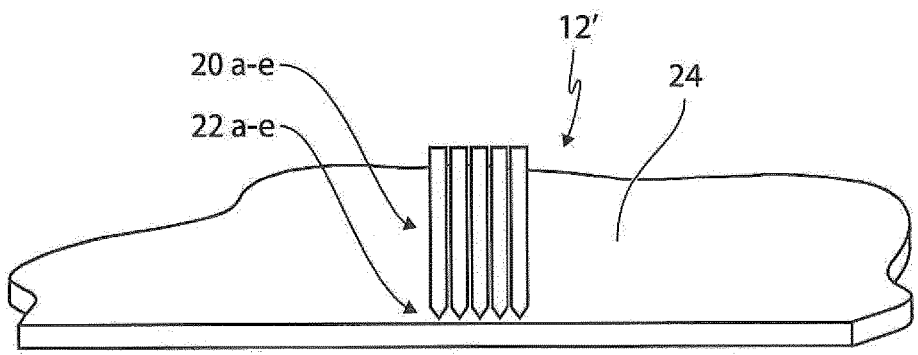
FIG. 2A is a schematic view of a first embodiment of a multi probe measurement setup performing a Hall effect measurement adjacent the boundary.

FIG. 2A shows a first embodiment of a multi probe measurement setup 12' in accordance with the present invention. In the present setup 12', a micro-Hall effect measurement is made adjacent to a boundary of the test sample 24' meaning that the electrodes 22*a-e* are contacting the surface of the test sample 24' adjacent an outer edge of the test sample 24' or alternatively adjacent an insulating barrier of the test sample 24'. The test sample 24' is a single semi-infinite layer test sheet.

Figure 2B:
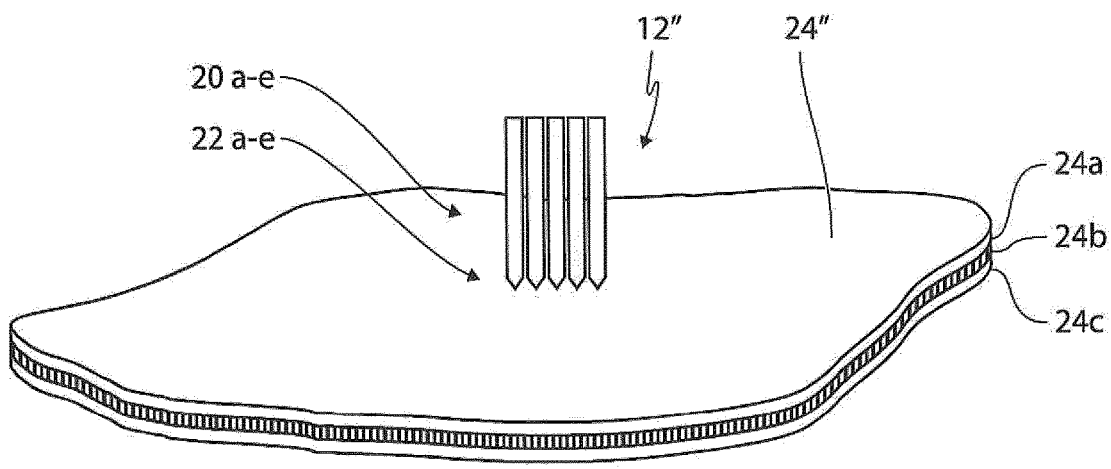
FIG. 2B is a schematic view of a second embodiment of a multi probe measurement setup performing a current in plane tunnelling (CIPT) measurement.

FIG. 2B shows a second embodiment of a multi probe measurement setup 12" in accordance with the present invention. In the present setup 12", a current in plane tunnelling (CIPT) measurement is made on the test sample 24". The test sample 24 comprises multiple layers constituting a top conductive layer 24*a*, a bottom conductive layer 24*b* and an insulating layer 24*c* in-between the top layer 24*a* and the bottom layer 24*b*. This constitutes a magnetic tunnel junction. The electrodes are contacting the surface of the top layer 24*a* of the test sample 24'. Additional layers are possible.

Figure 2C:
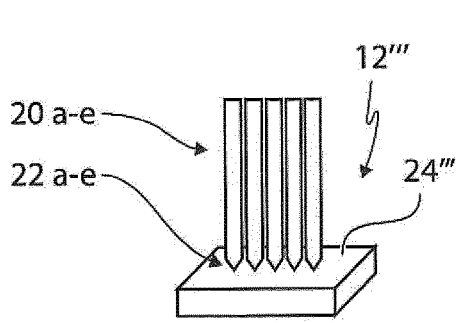
FIG. 2C is a schematic view of a third embodiment of a multi probe measurement setup 12''' in accordance with the present invention. In the present setup 12''', a Hall effect measurement is made on a small test sample 24'''.

FIG. 2C shows a third embodiment of a multi probe measurement setup 12''' in accordance with the present invention. In the present setup 12''', a Hall effect measurement is made on a small test sample 24''' meaning that the test sample has approximately the same size as the distance between the outermost probe arms 20*a* and 20*e*, or slightly larger. The test sample 24''' is a single layer test sheet.

Figure 2D:
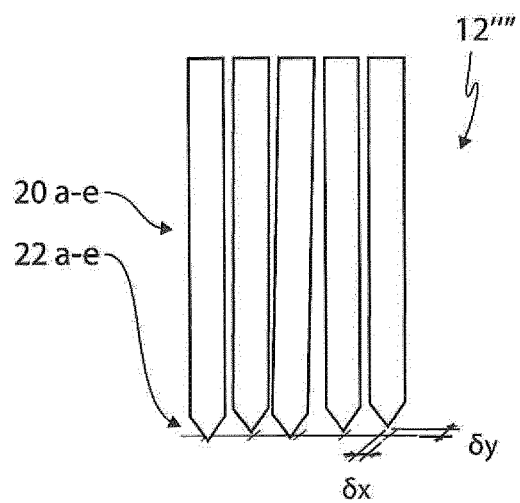
FIG. 2D is a schematic view of the ideal electrode positions versus the real electrode positions for an occasional probe landing.

FIG. 2D shows the ideal electrode positions as a + and one example of real electrode positions for an occasional probe landing. The difference between the ideal and real electrode positions is designated $\delta_x$ and $\delta_y$.

Figure 3A:
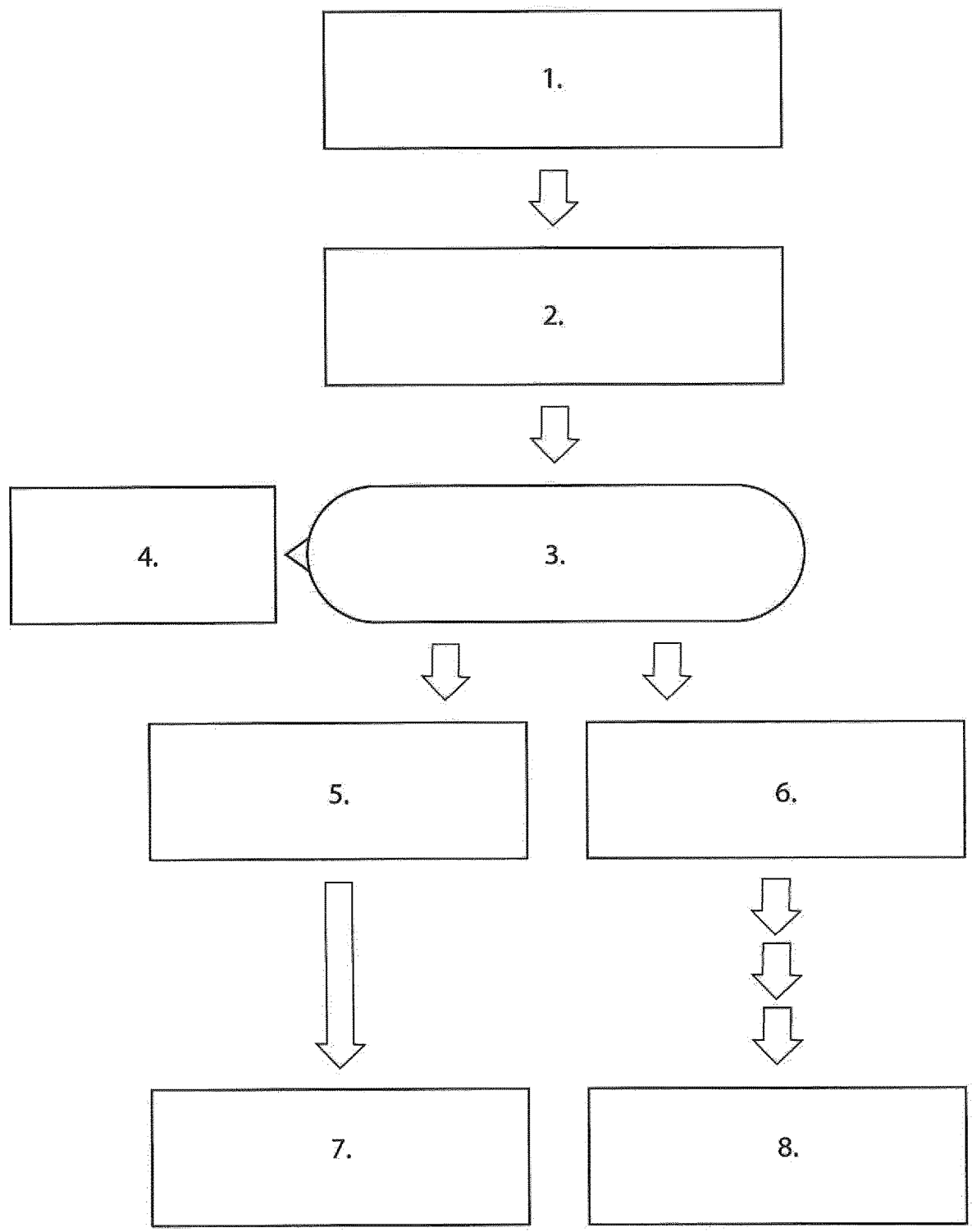
FIG. 3A is a flow chart showing the steps of performing a current in place tunnelling measurement for magnetic tunnel junctions.

FIG. 3A shows the steps of performing a current in place tunnelling measurement for magnetic tunnel junctions. The steps are described below:

1: The sample is provided and a model is established corresponding to the sample and the measurement.

2: Resistance measurements are performed using the multi probe measurement setup.

3: The industry is moving towards smaller characteristic length scales of the test samples in order to be able to design compact devices.

4: The obvious solution to perform accurate measurement would be to use a smaller electrode distance, increase the measurement current or fabricate probes with more pins in order to keep a high accuracy of the measurement.

5: In the prior art, electrode position corrections were made according to van der Pauw or Rymaszewski, which assume an infinite single layer test sample.

6: The sample parameters derived for multi-layered test samples (MTJ) or micro-Hall measurements near the boundary will be incorrect.

7: Instead, it is suggested that the exact geometry is used for the position correction, i.e. the test sample, probe position is taken into account for establishing a better model used in the measurement setup.

8: Better results are achieved by better position correction.

Figure 3B:
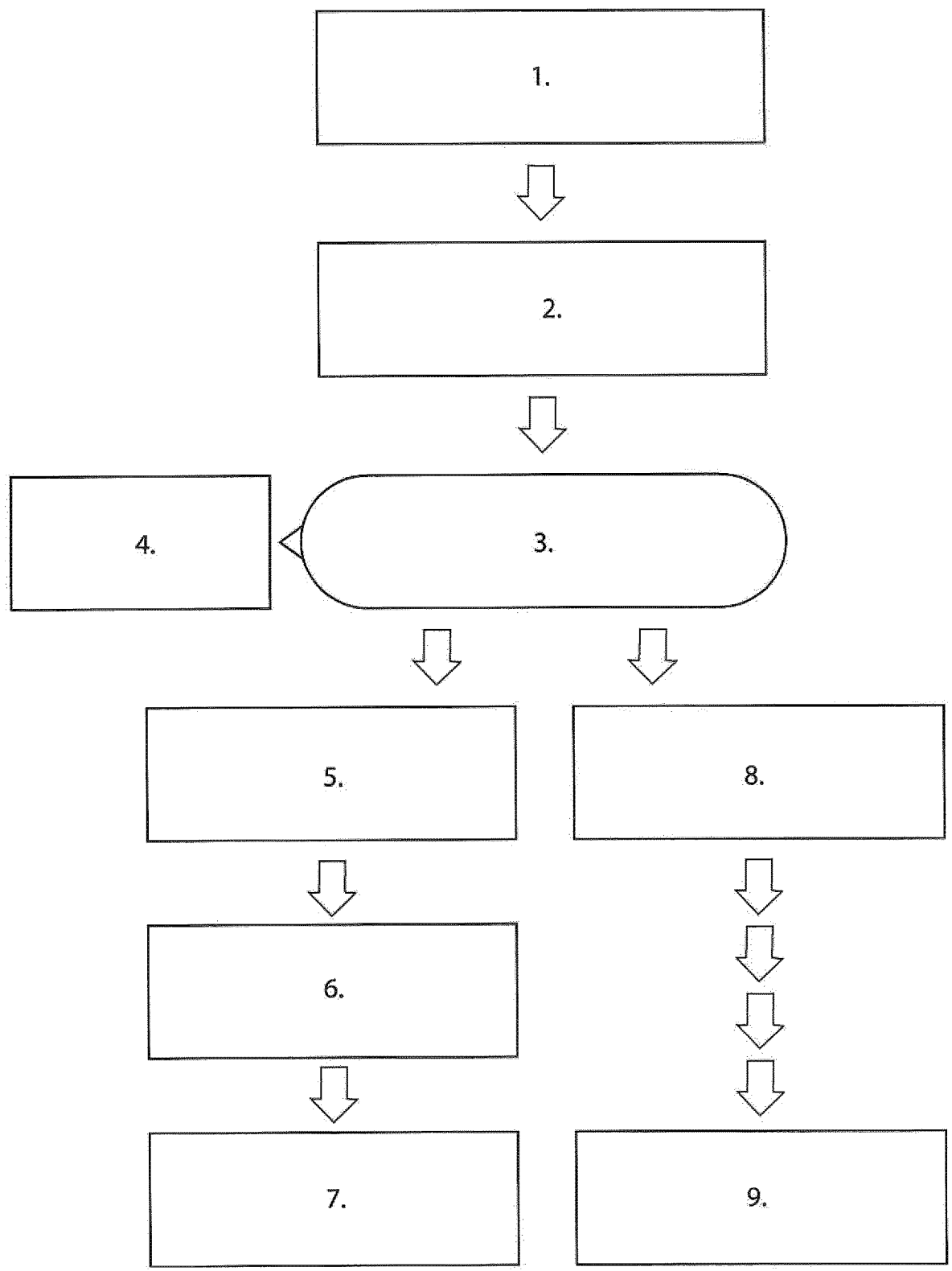
FIG. 3B is a flow chart showing the steps of performing a micro Hall effect measurement for semiconductors.

FIG. 3B shows the steps of performing a micro Hall effect measurement for semiconductors. The steps are described below:

1: The sample is provided and a model is established corresponding to the sample and the measurement.

2: Resistance measurements are performed using the multi probe measurement setup.

3: The industry is moving towards smaller characteristic length scales of the test samples in order to be able to design compact devices.

4: The obvious solution to perform accurate measurement would be to use a smaller electrode distance, increase the measurement current or fabricate probes with more pins in order to keep a high accuracy of the measurement.

5: A correction free Hall effect approximation is made.

6: In the prior art, electrode position corrections were made according to van der Pauw or Rymaszewski, which assume an infinite single layer test sample.

7: The sample parameters derived for multi-layered test samples (CIPT) or Hall measurements near the boundary will be incorrect.

8: Instead, it is suggested that the exact geometry is used for the position correction, i.e. the test sample, probe position is taken into account for establishing a better model used in the measurement setup.

9: Better results are achieved by better position correction, allows fully automatic tools, higher quality control, better precision, MTJ stack with one or multiple tunnelling barrier, smaller test samples and thicker electrodes.

Figure 4A:
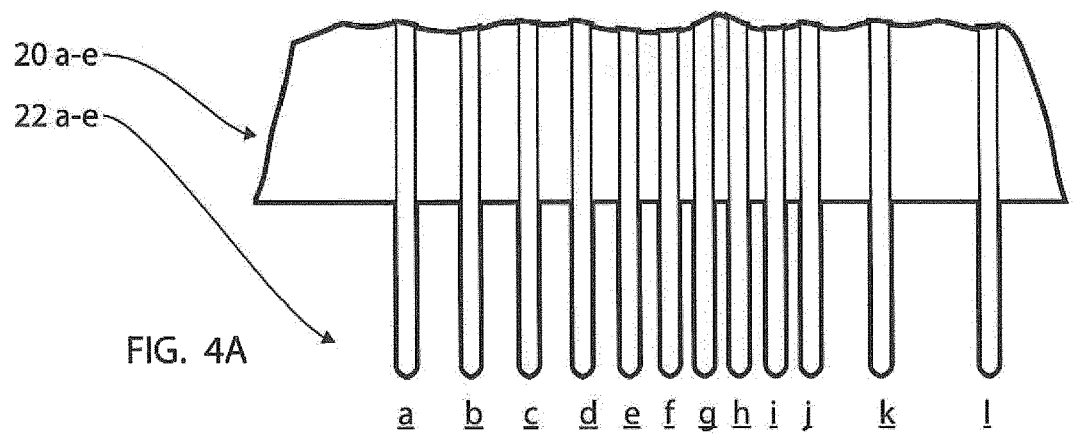
FIG. 4A is a schematic view of a twelve point probe according to the present invention.

FIG. 4A shows a twelve point probe according to the present invention. The twelve-point probe has twelve probe arms 20*a-l*, each having an electrode 22*a-l*.

Figure 4B:
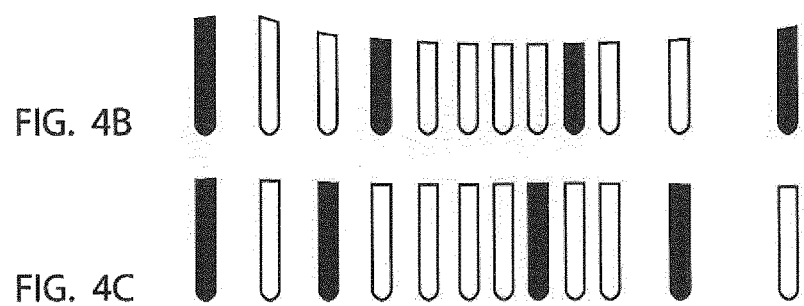
FIG. 4B is a schematic view of first measurement with the above probe in which four probe arms are selected.

FIG. 4B shows a first measurement with the above probe, in which four of the twelve probe arms 20*a-l* and corresponding electrodes 22*a-l* are selected, and of which two will constitute current electrodes between which a current is injected, and the other two will contribute voltage electrodes between which a voltage is measured. The selected electrodes are a, d, i, and l.

Figure 4C:
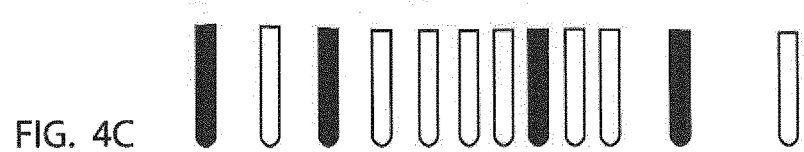
FIG. 4C is a schematic view of second measurement with the above probe in which four probe arms are selected.

FIG. 4C shows a second measurement with the above probe, in which four of the twelve probe arms 20*a-l* and corresponding electrodes 22*a-l* are selected. The selected electrodes are a, c, h, and k.

Figure 4D:
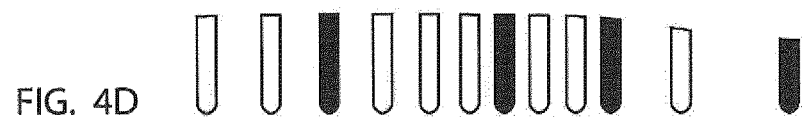
FIG. 4D is a schematic view of third measurement with the above probe in which four probe arms are selected.

FIG. 4D shows a second measurement with the above probe, in which four of the twelve probe arms 20*a-l* and corresponding electrodes 22*a-l* are selected. The selected electrodes are c, g, j, and l.

Figure 4E:
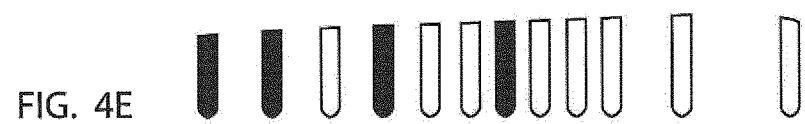
FIG. 4E is a schematic view of fourth measurement with the above probe in which four probe arms are selected.

FIG. 4E shows a second measurement with the above probe, in which four of the twelve probe arms 20*a-l* and corresponding electrodes 22*a-l* are selected. The selected electrodes are a, b, d, and g.

Figure 4F:
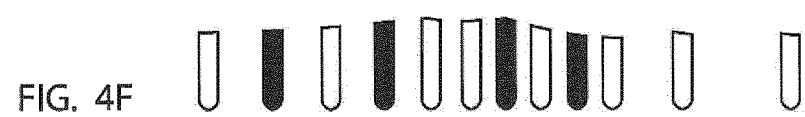
FIG. 4F is a schematic view of fifth measurement with the above probe in which four probe arms are selected.

FIG. 4F shows a second measurement with the above probe, in which four of the twelve probe arms 20*a-l* and corresponding electrodes 22*a-l* are selected. The selected electrodes are b, d, g, and i.

Figure 4G:
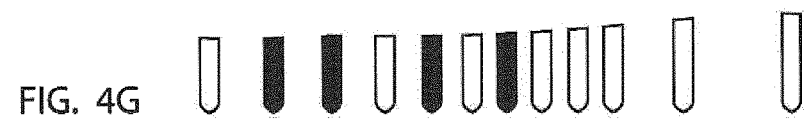
FIG. 4G is a schematic view of sixth measurement with the above probe in which four probe arms are selected.

FIG. 4G shows a second measurement with the above probe, in which four of the twelve probe arms 20a-l and corresponding electrodes 22a-l are selected. The selected electrodes are b, c, e, and g.

Figure 4H:
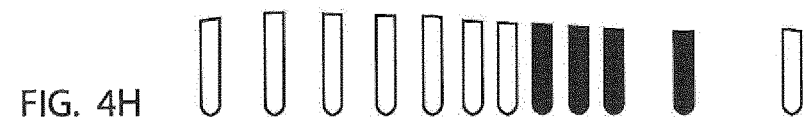
FIG. 4H is a schematic view of seventh measurement with the above probe in which four probe arms are selected.

FIG. 4H shows a second measurement with the above probe, in which four of the twelve probe arms 20a-l and corresponding electrodes 22a-l are selected. The selected electrodes are h, i, j, and k.

Figure 4I:
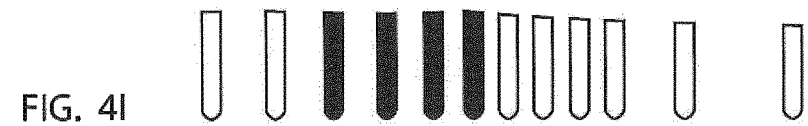
FIG. 4I is a schematic view of eighth measurement with the above probe in which four probe arms are selected.

FIG. 4I shows a second measurement with the above probe, in which four of the twelve probe arms 20a-l and corresponding electrodes 22a-l are selected. The selected electrodes are c, d, e, and f.

Figure 5A:
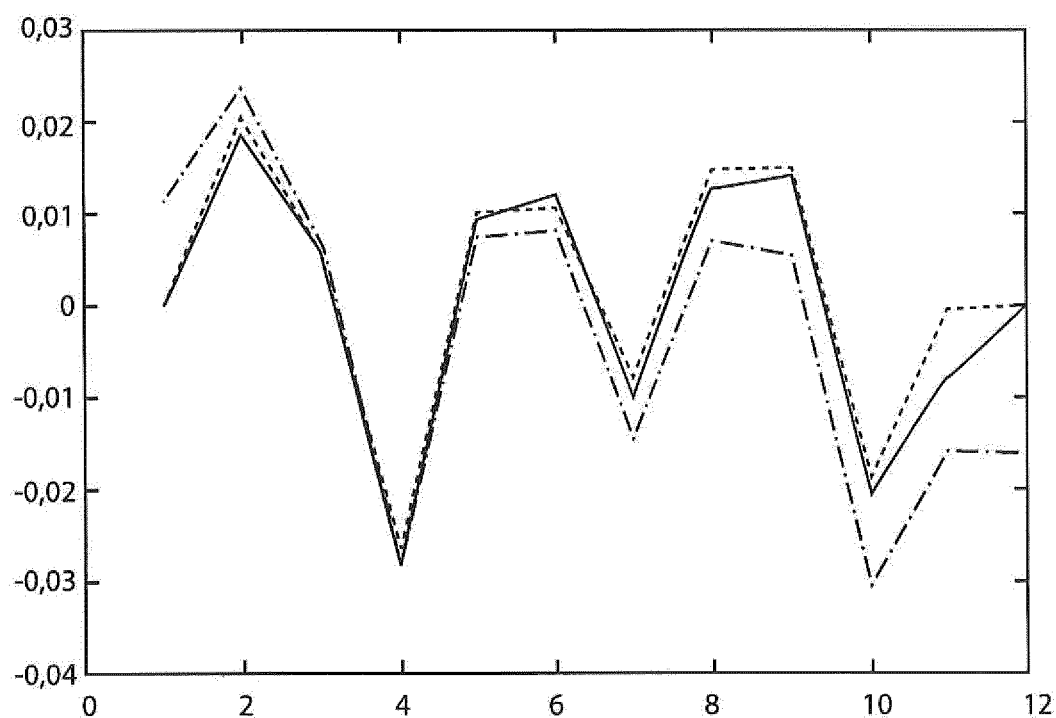
FIG. 5A are B are graphs showing on the ordinate axis, the simulated relative error in percent and on the abscissa, the pin spacing index.
Figure 5B:
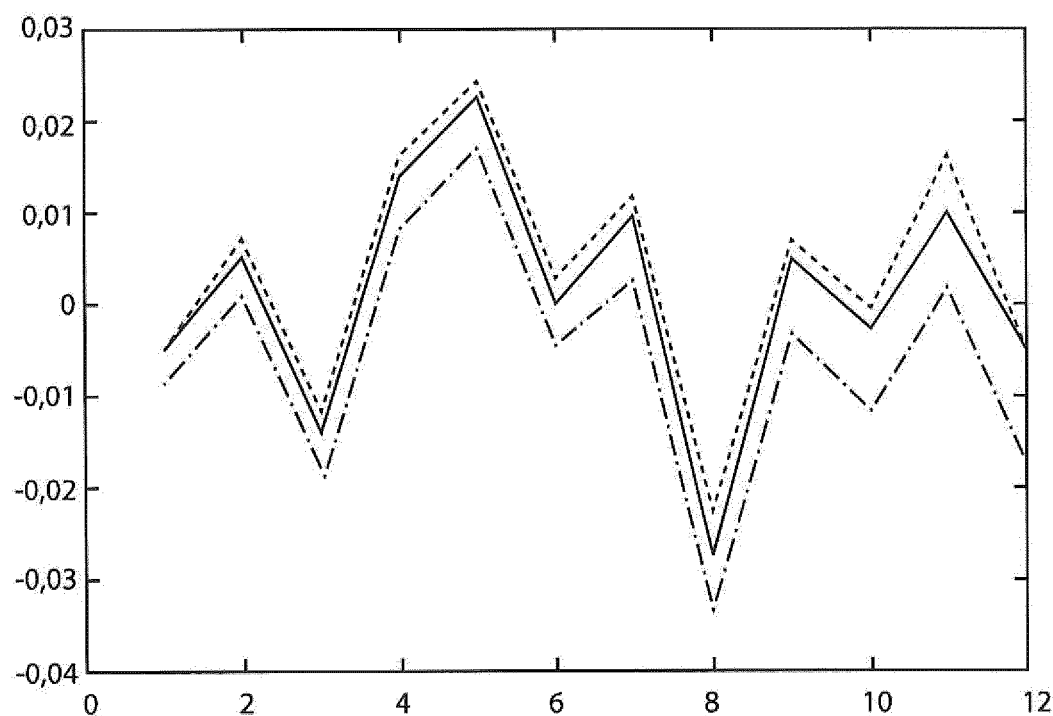

FIGS. 5A and B are two graphs, representing two proof of concept experiments, each showing on the ordinate axis the position error (in micrometers) of the electrode positions for two simulated CIPT measurements and on the abscissa an index that identifies each electrode. The dash-dotted line represents the simulated real position error of each electrode for two specific simulated CIPT measurements, the dashed and solid lines represent the position error estimations done by the position correction method according to the present invention. As can be seen the estimated position errors follow remarkably well the real position errors.

Figure 6A:
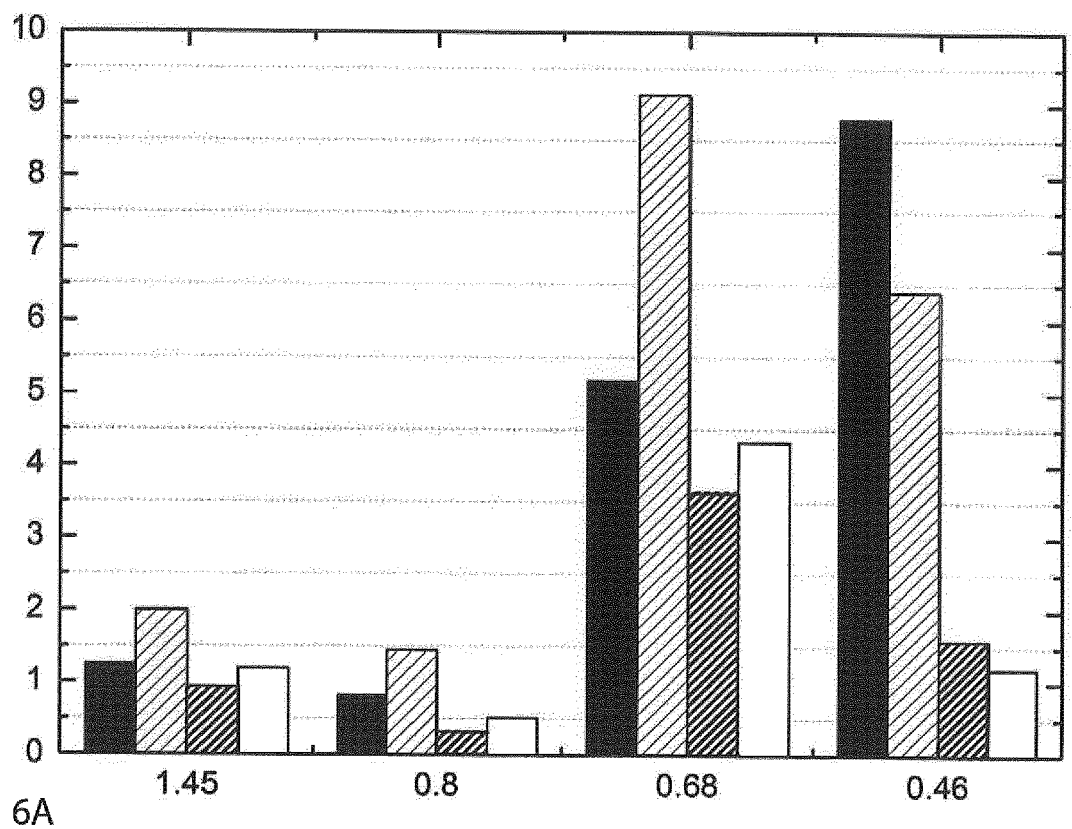
FIG. 6A is a bar diagram showing on the ordinate axis, the relative standard deviation of the estimated magnetoresistance (MR) and resistance area product (RA) and on the abscissa, different characteristic length scales of the test sample.

FIG. 6A is a bar diagram showing on the ordinate axis the relative standard deviations of the estimated magnetoresistance (MR) and resistance area product (RA) and on the abscissa different characteristic length scales in μm for the corresponding four test samples under test. As proof of concept of the benefit of the invention for CIPT measurements, the experiment was conducted by measuring on four different MTJ samples 100 data points and the repeatability (defined as the relative standard deviation) has been calculated. The filled bar designates RA derived according to the prior art technique, the coarsely hatched bar designates MR derived according to the prior art technique, the finely hatched bar designates RA derived according to the technique claimed according to present invention and the non-filled bar designates MR derived according to the technique claimed according to present invention. For each of the four samples there is a drastic reduction in the relative standard deviations both on the MR and RA parameter implies a much improved repeatability of the CIPT measurement. The improvement for the sample with lambda 0.46 μm is about 80% on the repeatability of MR.

Figure 6B:
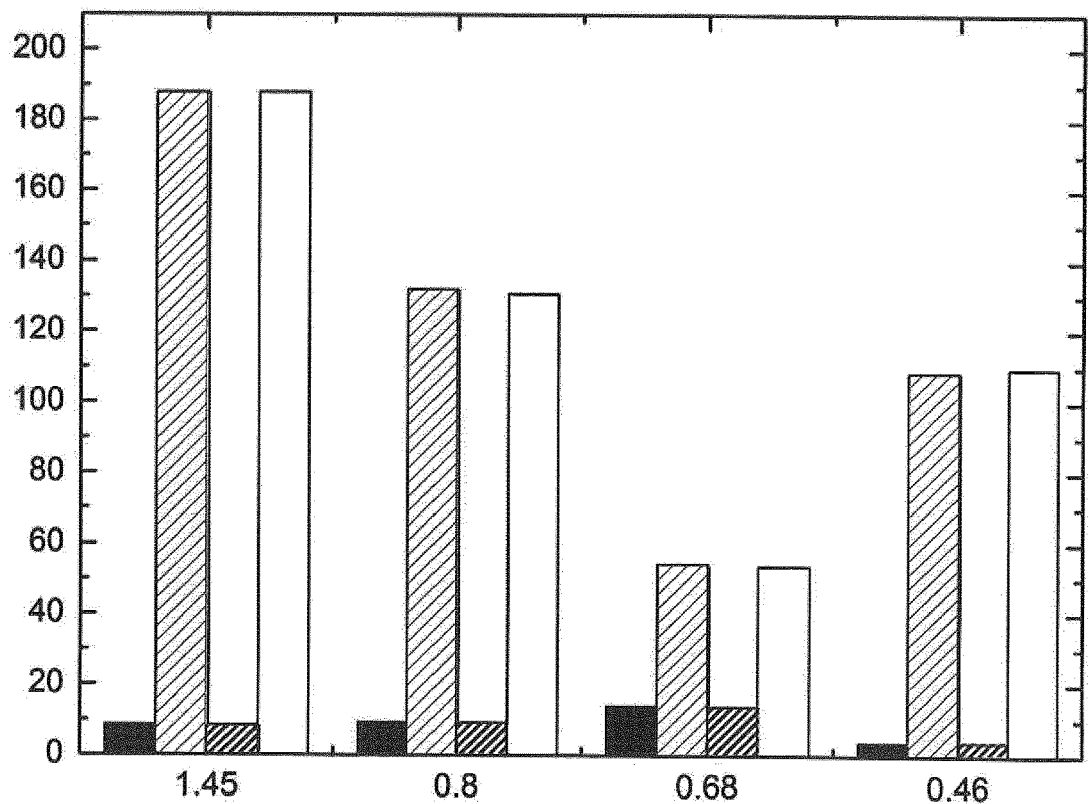
FIG. 6B is a bar diagram showing on the ordinate axis, the mean value of the estimated magnetoresistance (MR) and resistance area product (RA) and on the abscissa, different characteristic length scales of the test sample.

FIG. 6B is a bar diagram showing on the ordinate axis the mean values of the estimated magnetoresistance (MR) and resistance area product (RA) and on the abscissa different characteristic length scales in μm for the corresponding four test samples under test. As proof of concept of the benefit of the invention for CIPT measurements, the experiment was conducted by measuring on four different MTJ samples 100 data points and the mean values have been calculated. The filled bar designates RA derived according to the prior art technique, the coarsely hatched bar designates MR derived according to the prior art technique, the finely hatched bar designates RA derived according to the technique claimed according to present invention and the non-filled bar designates MR derived according to the technique claimed according to present invention. As can be seen, the mean values calculated using the prior art methods for position correction are the same as the mean values estimated using the invention to compensate for position errors. Clearly the mean values should be dependent only on the sample and not from the error position correction method used.

Figure 7A:
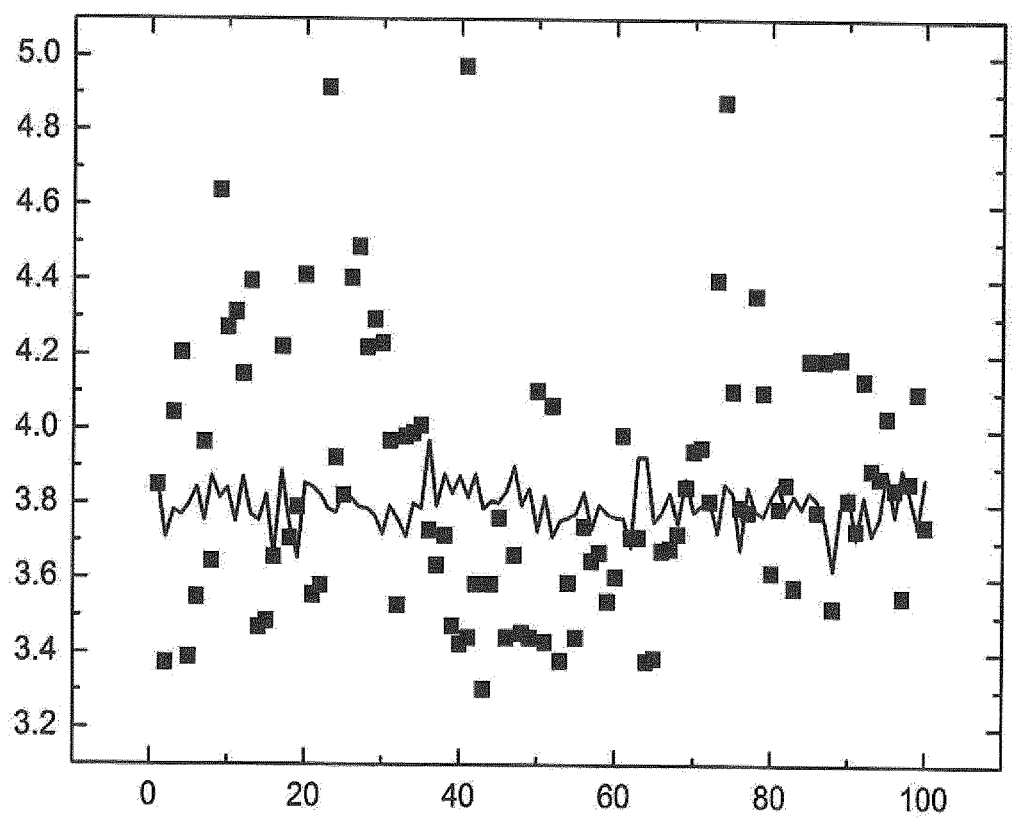
FIG. 7A is a graph showing on the ordinate axis, the resistance area product (RA) and on the abscissa, the number of the probe landing for MTJ sample.

FIG. 7A is a graph showing on the ordinate axis, the resistance area product (RA) in $\Omega\mu m^2$ and on the abscissa, the number of the probe landing. 100 probe landings are made in total in this proof of concept experiment using a test sample having a lambda of 0.46 μm. The filled squares designate RA derived according to the prior art technique, whereas the line designates RA derived according to the technique claimed according to the present invention.

Figure 7B:
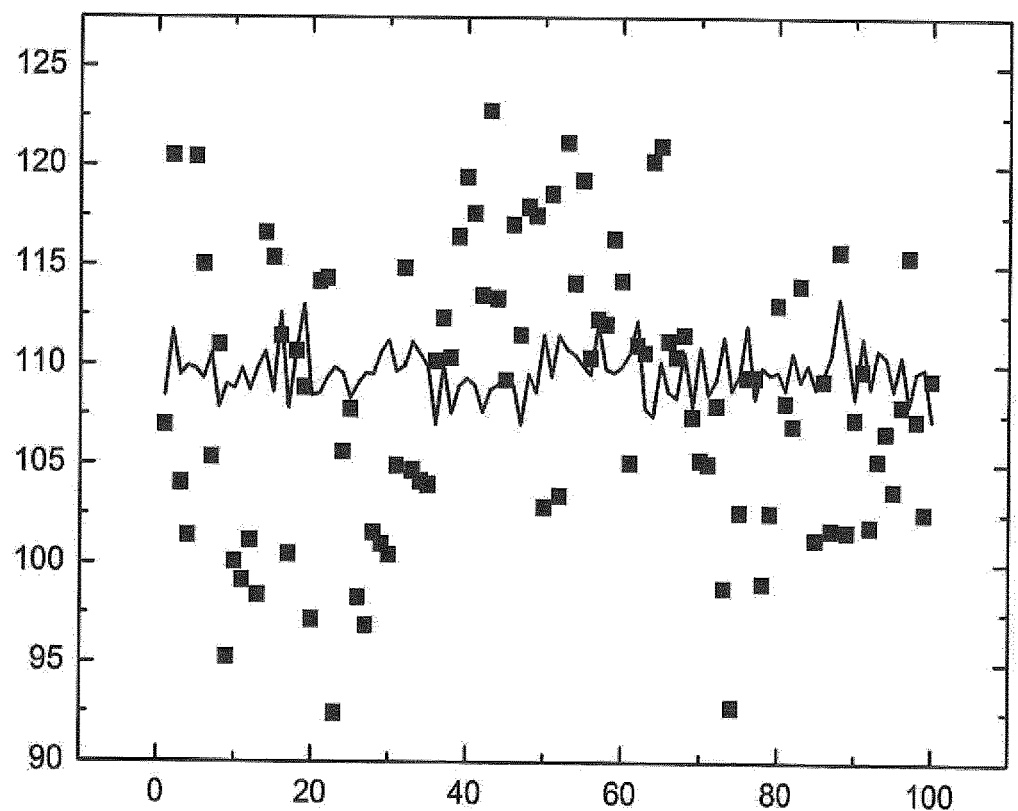
FIG. 7B is a graph showing on the ordinate axis, the magnetoresistance (MR) and on the abscissa, the number of the probe landing for MTJ sample.

FIG. 7B is a graph showing on the ordinate axis, the magnetoresistance (MR) in % and on the abscissa, the number of the probe landing. 100 probe landings are made in total in this proof of concept experiment using a test sample having a lambda of 0.46 μm. The filled squares designate MA derived according to the prior art technique, whereas the line designates MA derived according to the technique claimed according to the present invention.

Figure 7C:
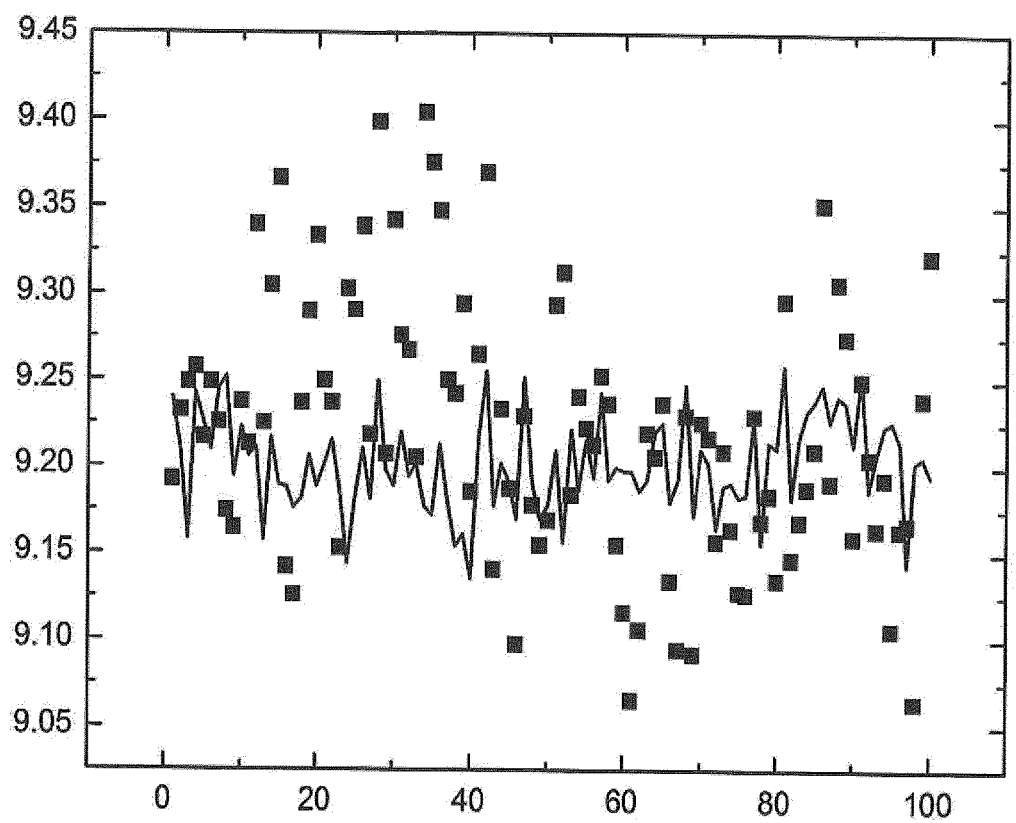
FIG. 7C is a graph showing on the ordinate axis, the resistance area product (RA) and on the abscissa, the number of the probe landing for MTJ sample.

FIG. 7C is a graph showing on the ordinate axis, the resistance area product (RA) in $\Omega\mu m^2$ and on the abscissa, the number of the probe landing. 100 probe landings are made in total in this proof of concept experiment using a test sample having a lambda of 0.8 μm. The filled squares designate RA derived according to the prior art technique, whereas the line designates RA derived according to the technique claimed according to the present invention.

Figure 7D:
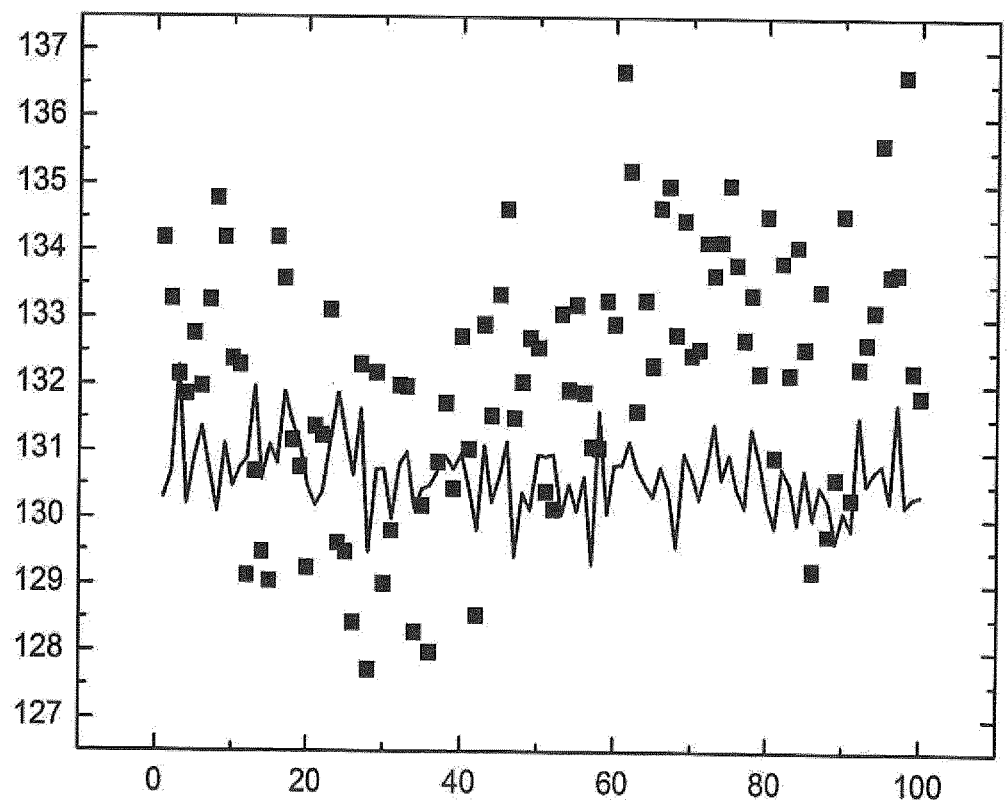
FIG. 7D is a graph showing on the ordinate axis, the magnetoresistance (MR) and on the abscissa, the number of the probe landing for MTJ sample.

FIG. 7D is a graph showing on the ordinate axis, the magnetoresistance (MR) in % and on the abscissa, the number of the probe landing. 100 probe landings are made in total in this proof of concept experiment using a test sample having a lambda of 0.8 μm. The filled squares designate MA derived according to the prior art technique, whereas the line designates MA derived according to the technique claimed according to present invention.

The above graphs illustrate the drastically improved precision, in particular the repeatability, of the technique claimed according to present invention.

The above-described embodiments describe specific realizations according to the present invention showing specific features, however, it is apparent to the skillful individual that the above-described embodiments may be modified, combined or aggregated to form numerous further embodiments.

REFERENCE NUMERALS

10. Computer-based measurement system
12. Multi probe measurement setup
14. Stationary computer
16. Laptop computer
18. Probe body
20. Probe arms
22. Electrodes
24. Test sample

The invention claimed is:
1. A method of establishing specific electrode positions, on a surface of a test sample, of a multi-point probe that includes more than four parallel probe arms extending from a probe body, each of the probe arms including an electrode, wherein the method comprises the steps of:
 (a) positioning the multi-point probe such that each of the electrodes is in contact with the surface of the test sample;
 (b) selecting two of the electrodes of the multi-point probe;
 (c) determining a distance between the selected two of the electrodes;
 (d) establishing a resistance model representative of the test sample, the resistance model defining specific electrode positions of the multi-point probe relative to the surface of the test sample included as unknown parameters, the resistance model representing the test sample as at least one of a finite sheet and a multi-layered sheet;

(e) performing a plurality of different resistance measurements on the test sample with the multi-point probe, each of the resistance measurements including:
 (i) selecting four different electrodes of the multi-point probe;
 (ii) dividing the four different electrodes into a first pair of electrodes and a second pair of electrodes;
 (iii) applying a current propagating through the test sample between the first pair of electrodes;
 (iv) detecting a voltage induced between the second pair of electrodes; and
 (v) establishing a measured resistance based on a ratio of the voltage and the current;

(f) establishing for each of the different resistance measurements a corresponding predicted resistance based on the resistance model;

(g) establishing a set of differences constituting the difference between each of the predicted resistances and its corresponding measured resistance; and (h) deriving the specific electrode positions of the multi-point probe on the surface of the test sample by using the distance between the selected two of the electrodes, and performing a data fit by minimizing an error function constituting the sum of the set of differences.

2. The method of claim 1, wherein the multi-point probe includes two outermost electrodes, and wherein the step of selecting two of the electrodes of the multi-point probe includes selecting the two outermost electrodes of the multi-point probe.

3. The method of claim 1, wherein the test sample is a multi-layered sheet comprising a top layer and a bottom layer, and constituting a magnetic tunnel junction, and wherein the resistance model represents a magnetic tunnel junction.

4. The method of claim 3, wherein the resistance model is defined by the equation:

$$R^i = \frac{R_T R_B}{2\pi(R_T + R_B)} \left\{ \frac{R_T}{R_B} \left( K_0\left(\frac{w^i}{\lambda}\right) + K_0\left(\frac{z^i}{\lambda}\right) - K_0\left(\frac{y^i}{\lambda}\right) - K_0\left(\frac{x^i}{\lambda}\right) \right) + \ln\left(\frac{x^i y^i}{z^i w^i}\right) \right\},$$

where $R_T$ is the top-layer resistance, $R_B$ is the bottom-layer resistance and $\lambda$ is the transition length, $K_0$ is the modified Bessel function of the second kind, 0'th order, the values $x^i$, $y^i$, $z^i$ and $w^i$ are the distances between probe arms in a given configuration, and $\lambda$ is given by $$\lambda = \sqrt{\frac{RA}{R_T + R_B}},$$

where RA is the product of resistance and rest sample surface area.

5. The method of claim 1, wherein the electrodes are placed adjacent a boundary of the surface of the test sample, and wherein the resistance model represents a micro-Hall effect measurement.

6. The method of claim 5, wherein the surface of the test sample extends in any direction less than twice the distance between two outermost electrodes of the multi-point probe.

7. The method of claim 5, wherein at least one of the electrodes is located closer to the boundary than twice the distance between two outermost electrodes of the multi-point probe.

8. The method of claim 5, wherein the resistance model is defined by the equation:

$$R_{HALL} = \frac{R_0}{4\pi}\left[\left(1 + \frac{R_H^2}{R_0^2}\right)\ln\frac{(x^i)^2(y^i)^2}{(z^i)^2(w^i)^2} + \left(1 - \frac{R_H^2}{R_0^2}\right)\ln\frac{[(x^i)^2 + 4l^2][(y^i)^2 + 4l^2]}{[(z^i)^2 + 4l^2][(w^i)^2 + 4l^2]}\right] + \frac{R_H}{\pi}\left[\arctan\frac{z^i}{2l} + \arctan\frac{x^i}{2l} + \arctan\frac{w^i}{2l} - \arctan\frac{y^i}{2l}\right],$$

where $R_0$ is the sheet resistance of the test sample, $R_H$ is the Hall effect sheet resistance of the test sample, $x^i$, $y^i$, $z^i$, and $w^i$ are the distances between probe arms in a given configuration, and l is the distance between a collinear probe arm and a parallel insulating test sample boundary.

9. The method of claim 1, wherein the test sample is of a semiconductor material.

10. The method of claim 1, wherein the error function is: $e = \sum_{n=1}^{m}(f(\alpha, \beta_n) - R_n(\beta_n))^2$, in which $\alpha$ constitutes the electrical test sample parameters, and $\beta_n$ represents the specific electrode positions.

11. The method of claim 1, further comprising the additional step of measuring at least one electrical parameter of the test sample selected from the group consisting of current, voltage, and resistance.

12. The method of claim 1, further comprising the additional step of determining a sheet resistance of the test sample.

13. A computer-based system for establishing specific electrode positions, on a surface of a test sample, of a multi-point probe, the system comprising:
 a multi-point probe having a probe body and more than four parallel probe arms extending from the probe body, each of the probe arms including an electrode, the multi-point probe being positionable such that each of the electrodes is in contact with a surface of a test sample, wherein, when the multi-point probe is so positioned, a distance is defined between two outermost electrodes of the multi-point probe, the system further including a resistance model representative of the test sample, the resistance model having the specific electrode positions of the multi-point probe relative to the surface of the test sample included as unknown parameters, the resistance model representing the test sample as at least one of a finite sheet and a multilayered sheet, the system further comprising:
 first means for performing a plurality of different resistance measurements, each of the resistance measurements including:
  (i) selecting four different electrodes of the multi-point probe;
  (ii) dividing the four different electrodes into a first pair of electrodes and a second pair of electrodes;
  (iii) applying a current propagating through the test sample between the first pair of electrodes;
  (iv) detecting a voltage induced between the second pair of electrodes; and
  (v) establishing a measured resistance based on a ratio of the voltage and the current;

second means for establishing, for each of the different resistance measurements, a corresponding predicted resistance based on the resistance model;

third means for establishing a set of differences constituting the difference between each of the predicted resistances and its corresponding measured resistance; and fourth means for deriving the specific electrode positions of the multi-point probe on the surface of the test sample by using the distance between the two outermost electrodes and performing a data fit by minimizing an error function constituting the sum of the set of differences.

14. The system of claim 13, wherein the test sample is a multi-layered sheet comprising a top layer and a bottom layer, and constituting a magnetic tunnel junction, and wherein the resistance model represents a magnetic tunnel junction.

15. The system of claim 13, wherein the multi-point probe is positionable such that the electrodes are placed adjacent a boundary of the surface of the test sample, and wherein the resistance model represents a micro-Hall effect measurement.

16. The system of claim 15, wherein the multi-point probe is positionable such that at least one of the electrodes is located closer to the boundary than twice the distance between two outermost electrodes of the multi-point probe.

17. The system of claim 15, wherein the resistance model is defined by the equation:

$$R_{HALL} = \frac{R_0}{4\pi}\left[\left(1+\frac{R_H^2}{R_0^2}\right)\ln\frac{(x^i)^2(y^i)^2}{(z^i)^2(w^i)^2}+\left(1-\frac{R_H^2}{R_0^2}\right)\ln\frac{[(x^i)^2+4l^2][(y^i)^2+4l^2]}{[(z^i)^2+4l^2][(w^i)^2+4l^2]}\right] + \frac{R_H}{\pi}\left[\arctan\frac{z^i}{2l}+\arctan\frac{x^i}{2l}+\arctan\frac{w^i}{2l}-\arctan\frac{y^i}{2l}\right],$$

where $R_O$ is the sheet resistance of the test sample, $R_H$ is the Hall effect sheet resistance of the test sample, $x^i$, $y^i$, $z^i$ and $w^i$ are the distances between probe arms in a given configuration, and l is the distance between a collinear probe arm and a parallel insulating test sample boundary.

18. The system of claim 13, wherein the error function is: $e=\Sigma_{n=1}^{m}(f(\alpha,\beta_n)-R_n(\beta_n))^2$ in which $\alpha$ constitutes the electrical sample parameters, and $\beta_n$ represents the specific electrode positions.

19. The system of claim 13, further comprising fifth means for measuring at least one electrical parameter of the test sample selected from the group consisting of current, voltage, and resistance.

20. The system of claim 13, further comprising fifth means for determining a sheet resistance of the test sample.

* * * * *